US008760817B2

(12) United States Patent
Boone, Jr. et al.

(10) Patent No.: US 8,760,817 B2
(45) Date of Patent: Jun. 24, 2014

(54) THREE-TERMINAL DESIGN FOR SPIN ACCUMULATION MAGNETIC SENSOR

(75) Inventors: Thomas Dudley Boone, Jr., San Jose, CA (US); Bruce Alvin Gurney, San Jose, CA (US); Neil Smith, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 864 days.

(21) Appl. No.: 12/470,827

(22) Filed: May 22, 2009

(65) Prior Publication Data
US 2010/0296202 A1 Nov. 25, 2010

(51) Int. Cl.
*G11B 5/33* (2006.01)

(52) U.S. Cl.
USPC .......................................... 360/313

(58) Field of Classification Search
None
See application file for complete search history.

(56) References Cited

U.S. PATENT DOCUMENTS

| | | | |
|---|---|---|---|
| 5,654,566 A | 8/1997 | Johnson | 257/295 |
| 6,870,717 B2 | 3/2005 | Childress et al. | 360/324.2 |
| 6,934,133 B2 | 8/2005 | Hayakawa et al. | 360/324.2 |
| 7,016,161 B2 | 3/2006 | Hayakawa | 360/322 |
| 7,071,010 B1 | 7/2006 | Lille | 438/3 |
| 7,209,328 B2 | 4/2007 | Ito et al. | 360/324.2 |
| 7,253,995 B2 | 8/2007 | Takahashi et al. | 360/324.2 |
| 7,280,322 B2 | 10/2007 | Takahashi et al. | 360/324.1 |
| 7,298,597 B2 | 11/2007 | Carey et al. | 360/324.2 |
| 2006/0022220 A1 | 2/2006 | Inomata et al. | 257/214 |
| 2006/0227466 A1 | 10/2006 | Yagami | 360/324.2 |
| 2006/0262458 A1 | 11/2006 | Carey et al. | 360/324.2 |
| 2007/0064342 A1* | 3/2007 | Nakamura et al. | 360/119 |
| 2007/0200156 A1 | 8/2007 | Wunderlich et al. | 257/296 |
| 2007/0238198 A1 | 10/2007 | Fontana, Jr. et al. | 438/3 |
| 2007/0253116 A1 | 11/2007 | Takahashi | 360/313 |
| 2007/0253121 A1 | 11/2007 | Yamada et al. | 360/324.11 |
| 2008/0176107 A1 | 7/2008 | Takahashi et al. | 428/810 |

FOREIGN PATENT DOCUMENTS

| | | | | |
|---|---|---|---|---|
| JP | 9214016 | 8/1997 | | G01R 33/09 |
| JP | 2005019561 | 1/2005 | | G11B 5/39 |
| JP | 2007250811 | 9/2007 | | H01L 29/82 |

OTHER PUBLICATIONS

T. Kimura et al., "Spin-dependent boundary resistance in the lateral spin-valve structure." Applied Physics Letters, vol. 85, No. 16, Oct. 18, 2004.
T. Kimura et al., "Spin-polarized current induced in a single ferromagnetic strip due to inhomogeneous spin injection" Journal of Applied Physics 97, 076102 (2005).
T. Kimura et al., "Estimation of spin-diffusion length from the magnitude of spin-current absorption: Multiterminal ferromagnetic/nonferromagnetic hybrid structures" Physical Review B 72, 014461 (2005).
S. Takahashi et al., "Spin injection and detection in magnetic nanostructures" Physical Review B 67, 052409 (2003).

* cited by examiner

*Primary Examiner* — Holly Rickman
*Assistant Examiner* — Linda Chau
(74) *Attorney, Agent, or Firm* — Zilka—Kotab, PC (57) ABSTRACT

A spin accumulation sensor having a three terminal design that allows the free layer to be located at the air bearing surface. A non-magnetic conductive spin transport layer extends from a free layer structure (located at the ABS) to a reference layer structure removed from the ABS. The sensor includes a current or voltage source for applying a current across a reference layer structure. The current or voltage source has a lead that is connected with the non-magnetic spin transport layer and also to electric ground. Circuitry for measuring a signal voltage measures a voltage between a shield that is electrically connected with the free layer structure and the ground. The free layer structure can include a spin diffusion layer that ensures that all spin current is completely dissipated before reaching the lead to the voltage source, thereby preventing shunting of the spin current to the voltage source.

14 Claims, 5 Drawing Sheets

THREE-TERMINAL DESIGN FOR SPIN ACCUMULATION MAGNETIC SENSOR

FIELD OF THE INVENTION

The present invention relates to magnetoresistive sensors and more particularly to a spin accumulation sensor having a three terminal configuration and a spin diffusion layer allowing the practical application of the spin accumulation sensor in a data recording system.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head has traditionally included a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic transitions in tracks on the moving media, such as in circular tracks on the aforementioned rotating disk.

In present read head designs, a TMR sensor is employed for sensing magnetic fields from the rotating magnetic disk. The sensor includes a tunneling barrier layer, sandwiched between first and second ferromagnetic layers, referred to as a reference and a free layer. First and second leads are connected to the sensor for applying a sense voltage across the barrier. The magnetization of the reference layer is fixed perpendicular to the air bearing surface (ABS) and the magnetization of the free layer is oriented parallel to the ABS, but free to rotate in response to external magnetic fields. The magnetization of the reference layer is fixed by either direct exchange-pinning with an antiferromagnetic layer, or by strong antiferromagnetic coupling to a third ferromagnetic "pinned" layer which is exchange-pinned by an antiferromagnetic layer.

When the magnetizations of the reference and free layers are parallel with respect to one another, tunneling current across the barrier is maximized. When the magnetizations of the reference and free layer are antiparallel, tunneling current is minimized. The change in conductance of the TMR varies as $\cos \theta$, where $\theta$ is the angle between the magnetizations of the reference and free layers. In a read mode the resistance of the TMR sensor changes proportionally to the magnitudes of the magnetic fields from the rotating disk. When a sense voltage is applied to the TMR sensor, resistance changes cause current changes that are detected and processed as playback signals.

More recently researchers have developed perpendicular magnetic recording systems. Older longitudinal recording system, such as one that incorporates the write head described above, stores data as magnetic bits oriented longitudinally along a track in the plane of the surface of the magnetic disk. This longitudinal data bit is recorded by a fringing field that forms between the pair of magnetic poles separated by a write gap.

A perpendicular recording system, by contrast, records data as magnetizations oriented perpendicular to the plane of the magnetic disk. The magnetic disk has a magnetically soft underlayer covered by a thin magnetically hard top layer. The perpendicular write head has a write pole with a very small cross section and a return pole having a much larger cross section. A strong, highly concentrated magnetic field emits from the write pole in a direction perpendicular to the magnetic disk surface, magnetizing the magnetically hard top layer. The resulting magnetic flux then travels through the soft underlayer, returning to the return pole where it is sufficiently spread out and weak that it will not erase the signal recorded by the write pole when it passes back through the magnetically hard top layer on its way back to the return pole. While the advent of perpendicular magnetic data recording systems have provided advances in increasing data density, still further increases in data density are needed.

As the areal density of recording increases, the size of the read sensor decreases. Read sensor technology such as TMR was introduced when the technology preceding it was not able to deliver the necessary signal and signal-to-noise ratio at the necessarily smaller sensor sizes. Similarly, TMR read sensors may find a limited range of device size (and hence limited areal density) below which it too may be inadequate to achieve necessary signal-to-noise performance.

SUMMARY OF THE INVENTION

The present invention provides a spin accumulation read head sensor that has a three terminal design that allows the free layer to be located at the air bearing surface without unnecessary shunting of spin current, interference with the hard bias stabilization, or the fabrication difficulty of establishing a fourth contact at or near the air bearing surface. The sensor includes a reference layer structure located away from the air bearing surface and a free layer structure located at the air bearing surface. An internal non-magnetic, conductive spin-transport conducting layer extends from the reference layer structure to the free layer structure. For the present invention, removing the reference layer structure from the ABS allows its size to be substantially larger than that of the free layer structure, thereby reducing technical difficulties and signal-to-noise degradation associated with scaling down the size of the reference layer structure concomitantly with the free layer as required to achieve increased areal recording density.

A current or voltage source applied across the reference layer structure through a second lead connection results in spin-polarized electrical current through the reference layer which returns to a first current lead that is connected to a common "ground" connection. Simultaneously, a pure spin current can flow from the reference layer structure to and through the free layer structure through the aforementioned conductive spin-transport conducting layer. If the spin-conductance through the free layer is dependent on the orientation of the free layer magnetization relative to that of the reference layer, a (voltage sensing) amplifier connected to ground on one side, and to a third lead connection that is in electrical contact with the free-layer structure, can then detect a change in voltage generated across the free layer structure when the spin-current is modulated by the rotation of the free layer magnetization in response to magnetic signal fields from the rotating magnetic disk. For example, the conventional top and bottom magnetic shields of the read head can act as either of the first/ground and third lead connections (one shield being ground while the other is the third lead), such that the signal voltage is the measured electric potential difference between top and bottom shields, as is typically the case for a TMR sensor. However, because the third lead connection is the only external electrical connection to the free layer structure in the three-terminal design of the present invention, none of the spin current from the reference layer reaching the free layer structure will be otherwise shunted into a fourth lead connection to the opposite side of the free layer structure that is electrically connected to the third lead. In prior art spin accumulation devices a fourth lead is present and shunts some of the spin current, reducing the signal.

The free layer structure can include an insulating layer on that side (top or bottom) opposite to that electrically connected to the third lead, to keep it electrically insulated from direct contact to the shield layer serving as the first/ground lead connection. The free layer structure can also include a spin diffusion layer between the free layer and the shield acting as the third lead connection. This spin diffusion layer can be constructed of a metallic conductor having a short spin diffusion length, such as Pt, Ir or Re, and acts to diffuse the spin polarity of the spin current before it reaches the shield. This prevents the direction of the shield magnetization from playing the role of a second reference layer in influencing the spin-conductance through the free layer structure.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
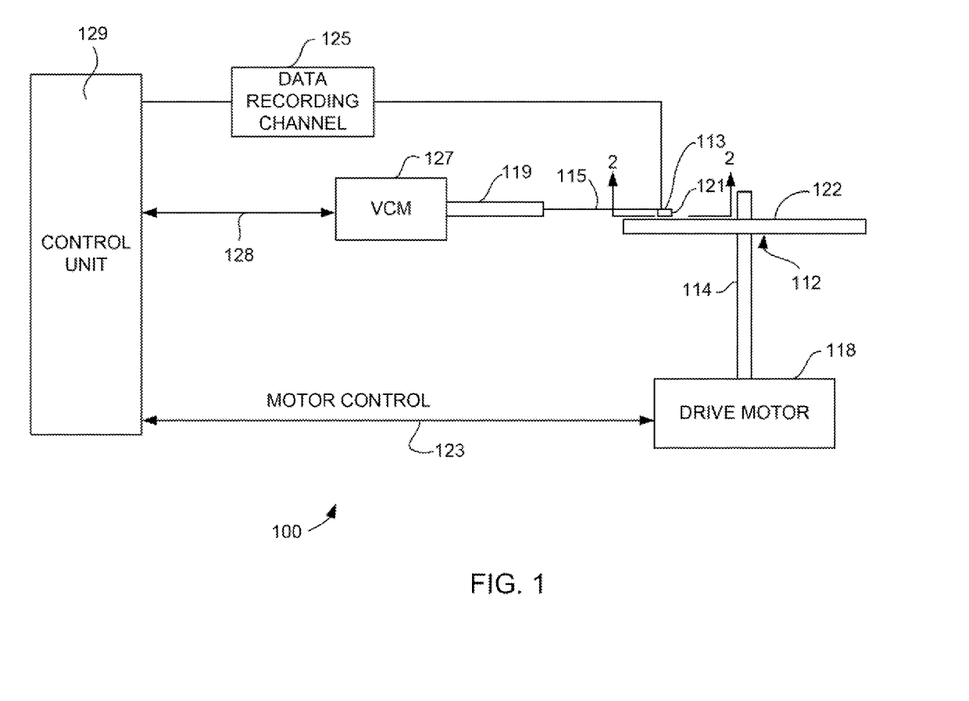
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
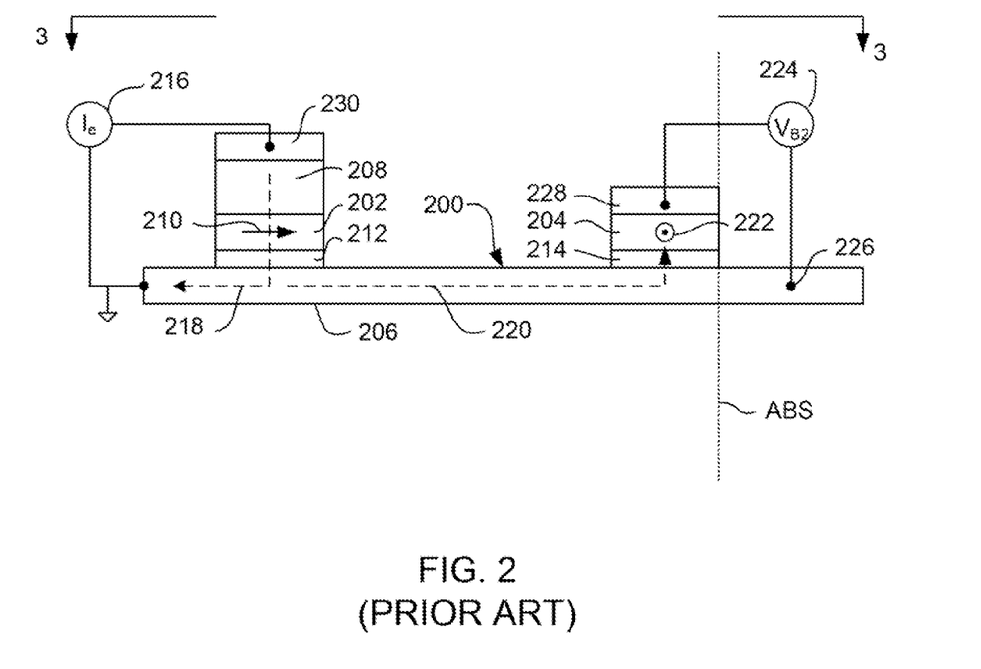
FIG. 2 is a side cross sectional view of a prior art spin accumulation device.

FIG. 2 shows a side cross sectional view of a prior art spin accumulation device. It should be pointed out that the device shown in FIG. 2 is a theoretical device only, the geometry of which is the natural extrapolation from devices of analogous geometry and equivalent four-terminal electrical connections discussed in the prior art literature. The device suffers from certain challenges (which will be discussed below) that render such a device unsuitable for use in an operational data recording system.

The device 200 includes a reference magnetic layer 202 and a free magnetic layer 204. The reference magnetic layer 202 is located a distance away from the free layer 204, which in a read head would be located at an air bearing surface which is indicated by the dashed line denoted "ABS". As mentioned before, the reference layer 202 has a magnetization 210 that is fixed in direction, and is typically perpendicular to the ABS. The free magnetic layer 204 would be located with an edge disposed at the ABS. A non-magnetic, conductive spin-transport conducting layer 206 extends from the reference layer 202 to the free layer 204. The layer 206 should be comprised of electrically conductive material with spin-diffusion length preferably longer than the distance between reference layer 202 and free layer 204.

A layer of antiferromagnetic material (AFM layer) 208 can be formed over and exchange coupled with the reference magnetic layer 202, to pin the magnetization 210 of the reference layer 202 in a desired direction perpendicular to the ABS plane. In addition, a first thin, non-magnetic, contact layer 212 can be provided between the reference layer 202 and the non-magnetic spin-conductive layer 206. Similarly, a second thin, non-magnetic, contact layer 214 can be provided between the free magnetic layer 204 and the spin-conductive layer 206. The contact layers 212 and 214 are chosen to promote spin-dependent electrical transport between the spin-conductive layer 206 and the reference layer 202 or the free layer 204, respectively, and can comprise either electrically conductive metallic-like layers, or tunnel barrier layers analogous to those used for TMR sensors in the prior art.

As can be seen, the device 200 is a four terminal device. A current source 216 applies an electrical current 218 across the reference layer structure, comprising an electrical contact layer 230, the AFM layer 208, reference layer 202, and contact layer 212, and which then enters the non-magnetic spin-conductive layer 206. As mentioned before, the reference layer 202 has a magnetization 210 that is fixed perpendicular to the ABS. Since the contact layer 212 promotes spin-dependent transport, this will result in a spin polarization of the electrons (polarized collinearly with the direction of the magnetization 210) which enter the spin-conductive layer 206. The purely electrical (or charge) component of this spin-polarized current 218 must necessarily return to the current source 216 through the ground connection. However, a pure spin current 220 of this spin-polarized current can additionally flow in the other direction along the spin-conductive layer 206 towards the free layer 204. Provided the spin diffusion length of spin-conductive layer 206 is comparable to or longer than the distance between reference and free layers, the magnitude (or degree of polarization) of this spin current will be mostly undiminished across this distance, and can possibly flow up through the free layer structure (214, 204, 228). If the contact layer 214 promotes spin-dependent transport between conductive layer 206 and the free-layer 204, a pure spin-current through the free layer structure will generate a purely electrical voltage across the free layer structure which can be detected by a voltage sensing amplifier 224 suitably connected across the free layer structure.

Figure 3:
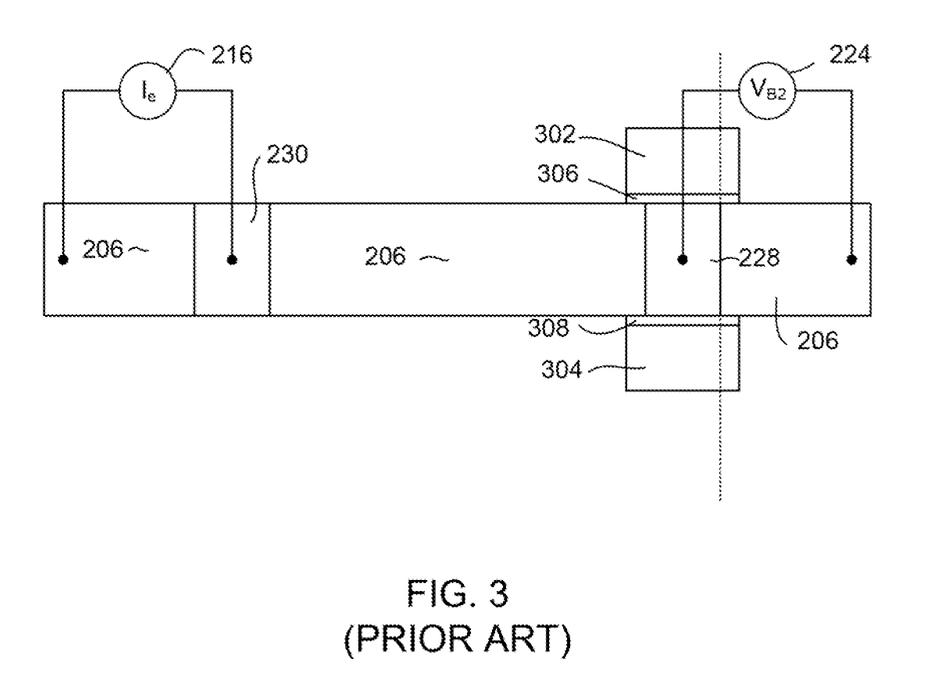
FIG. 3 is a top down view of the prior art spin accumulation device as viewed from line 3-3 of FIG. 2.

The free layer 204 has a magnetization that is biased in a direction parallel with the ABS as indicated by arrow head symbol 222. While this magnetization is biased parallel with the ABS, it is free to rotate in response to an external magnetic field. The biasing for the magnetization 222 is provided by hard magnetic bias layers 302, 304, that can be seen in FIG. 3. FIG. 3 shows a top down view as seen from line 3-3 of FIG. 2. The hard bias layers 302, 304 are magnetostatically coupled with the free layer 204 and are separated from the free layer 204 by thin insulation layers 306, 308.

The effective spin-impedance of a spin current traversing the contact layer 214 depends upon the orientation of the magnetization 214 relative to the polarization vector of the spin current, which as mentioned above, is determined by the magnetization 210 of the reference layer 202. The closer the magnetization 222 of the free 204 is to being parallel with the magnetization 210 of the reference layer 202, the lower the spin-impedance across the contact layer 214 will be. Conversely, the more antiparallel the magnetization 222 is with magnetization 210, the higher the spin-impedance across the contact layer 214 will be. Therefore, as the magnetization 222 rotates in response to an external magnetic field, the effective spin-impedance across the contact layer 214 will change. The product of the (change in) effective spin-impedance and the magnitude of the spin-current flowing up into the free layer structure determine the signal voltage detected by amplifier 224.

The above described structure, however, suffers from drawbacks that have made the implementation of such a device practically impossible. For example, in order for the structure to read the voltage across free layer 204 and second barrier layer 214, one side of the amplifier 224 must be electrically connected to the conductive layer 206 at a fourth contact point 226. In practice, the metallization at such a contact point will necessarily be relatively massive compared to the thin spin-conductive layer 206, and will behave as a perfect "spin-sink" of essentially zero spin-impedance for any spin current reaching contact point 226. Hence, to avoid shunting essentially all the spin-current away from the free layer structure (214, 204, 228) and into the contact point 226, it would be necessary to keep the location of contact point 226 a distance away from free-layer structure (214, 204, 228) that is preferably larger than the spin-diffusion length of layer 206. Even so, this would only partially alleviate the shunting problem, since the extended region of layer 206 would still act as an alternative, low to moderate spin-impedance shunt path for spin-current to travel away from and bypassing the free-layer structure (214, 204, 228), and dissipate (via spin-flip scattering) in this extended region.

However, this partial fix regarding a distant location for the contact point 226 is itself virtually impossible in practice. As can be seen, this requires that the layer 206 must extend far beyond the air bearing surface (ABS). This of course is unacceptable in an actual device, because the free layer must be located right at the ABS in order to effectively detect a magnetic signal. In addition, it would be very difficult to extend layer 206 sideways from the free layer structure (214, 204, 228) and parallel to the ABS, because these sides of the device are occupied by hard magnetic bias layers 302, 304 and insulation layers 306, 308 (as shown in FIG. 3) which are needed to bias the magnetization 222 of the free layer. Further yet, the size of the read gap is limited to only a few tens of nanometers in order to meet linear resolution requirements for the read-back signal. Making a fourth electrical contact to the free-layer structure (214, 204, 228) at/near the ABS and inside the read gap would be exceedingly difficult. Therefore, there is a need for a structure that can allow a spin accumulation device to be implemented in a functioning data recording system.

Figure 4:
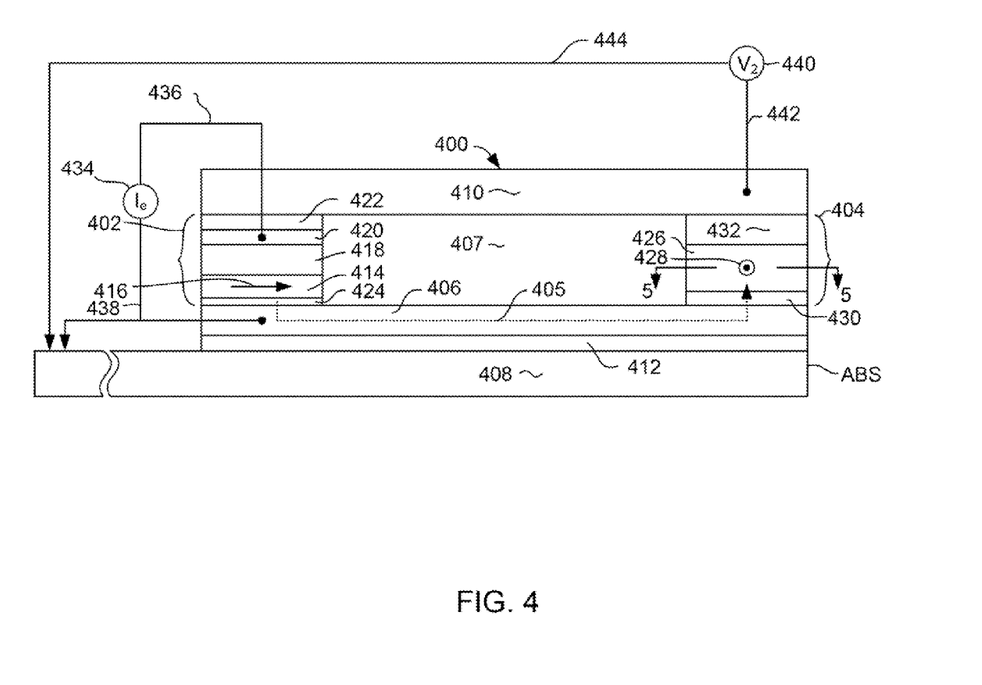
FIG. 4 is a side cross sectional view of a spin accumulation sensor according to an embodiment of the present invention.

With reference now to FIG. 4, a device 400 is provided that includes a reference layer structure 402 located away from an air bearing surface (ABS) and a free layer structure 404 located at the ABS. A non-magnetic, conductive spin-transport conducting layer 406, which for example can be made of copper, extends from the reference layer structure 402 to the free layer structure 404 and to the ABS. The reference layer structure 402 and free layer structure 404 are separated by a distance that is not greater than, and is preferably less than, the spin diffusion length of the spin-conductive layer 406. The spin-conductive layer 406 can extend to the Air Bearing Surface (ABS). The reference layer structure 402, free layer structure 404 and non-magnetic spin-conductive layer 406 are sandwiched between first and second magnetic shields 408, 410 which can be constructed of a material such as NiFe, or some other suitable magnetic, electrically conductive material. The non-magnetic spin-conductive layer 406 can be separated from the first shield 408 by an electrically insulating layer 412 such as alumina. A non-magnetic, electrically insulating fill layer 407 such as alumina can be provided to fill the space between the free layer structure 402 and the reference layer structure 404.

The reference layer structure 402 includes a ferromagnetic reference layer 414, which has a magnetization 416 that is fixed in a direction nominally perpendicular to the ABS. The reference layer can be exchange coupled with a layer of antiferromagnetic material (AFM layer 418) such as IrMn or PtMn which keeps the magnetization 416 pinned in the desired direction. An electrically conductive lead 420 can be provided over the AFM layer 418, and is separated from the second shield 410 by an electrically insulating layer 422. The electrically conductive lead layer 420 can extend out the sides and/or toward the back of the sensor 400 although this is not shown in FIG. 4. In addition, because the layers in the reference layer structure 402 are removed from the ABS, they can be made thicker and more numerous than the layers of the free layer structure 404 which are located at the ABS, with no affect on read gap (i.e. linear recording density). Similarly, the layers of the reference layer structure can be made wider in their planar dimensions with no affect on the track-width (i.e., recording track density) resolution of the read head. Therefore, although the free layer structure 404 and reference layer structure 402 are shown being about the same size and thickness, the reference layer structure 402 could be both wider and thicker than the free layer structure 404.

The lead 420 can be constructed of an electrically conductive material such as Au, Cu or some other material, and the insulating layer 422 can be alumina or some other electrically insulating material. A thin first contact layer 424 is sandwiched between the reference layer 414 and the non-magnetic spin-conductive layer 406. The contact layer 424 can be constructed of a tunneling barrier material such as alumina or MgO, a purely metallic layer such as Cu, or a hybrid "nano-oxide" layer consisting of a matrix of small conductive "pinholes" (e.g., Cu) inside an insulating material. The latter can have spin-dependent transport properties similar to a metal contact layer, but with a larger resistance-area product that is more comparable to that of a tunneling barrier.

Figure 5:
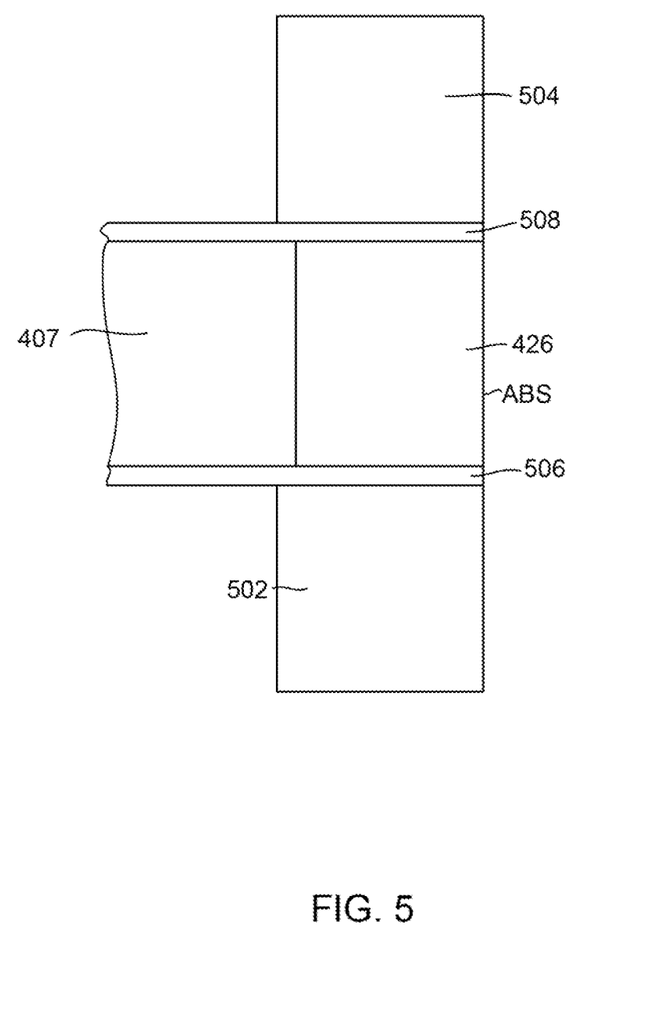
FIG. 5 is a top down sectional view of the spin accumulation sensor as viewed from line 5-5 of FIG. 4.

The free layer structure 404 includes a magnetic free layer 426 having a magnetization that is biased in a direction nominally parallel with the ABS as indicated by arrow head symbol 428. FIG. 5, shows hard magnetic bias layers 502, 504 formed at either side of the free layer 426. These hard bias layers 502, 504 are magnetostatically coupled with the free layer 426 to bias the magnetization 428 parallel with the ABS. The bias layers 502, 504 are separated from the free layer structure 402 by insulation layers 506, 508.

The free layer 426 can be constructed of one or more layers of Co, CoFe, NiFe or some other suitable magnetic material. A second nonmagnetic contact layer 430 is sandwiched between the free layer and the non-magnetic spin-conductive layer 406. Like the first contact layer 424, the second contact layer 430 can be constructed of a tunneling barrier material such as alumina or MgO, a purely conductive layer such as Cu, or a hybrid "nano-oxide" layer of a matrix of small conductive "pinholes (e.g., Cu) inside an insulating material. A layer of material having a short spin diffusion length (spin diffusing layer 432) is located between the free layer 426 and the second shield layer 410. This layer can be constructed of a material such as Pt, Ir or Re. The purpose of spin-diffusion layer 432 is to avoid having the direction of the second shield magnetization act as a secondary reference layer in influencing the spin-conductance through the free layer structure.

With continued reference to FIG. 4, a current source 434 is provided to supply a current through the reference layer structure 404. The current source 434 applies the current via a lead 436 that is connected with the lead layer 420, and another lead layer 438 that is connected with the non-magnetic metal and also with a ground. The connection with ground can be made at a location far removed from the ABS.

The application of an electrical current through the reference layer 414 and the first contact layer 424 results in a spin current 405 that travels through the non-magnetic spin-conductive layer 406 toward the ABS and the free layer structure 402. As the spin current 405 reaches the second contact layer 430, the effective spin-impedance across contact layer 430 depends upon the relative orientation of the magnetization 428 of the free layer 426 relative to the magnetization 416 of the reference layer 414. The more parallel the magnetization 428 is with the magnetization 416, the lower the spin-impedance across the contact 430 will be. Conversely, the more antiparallel the magnetizations 428, 416 are, the higher the spin-impedance will be. The product of the effective spin-impedance and the magnitude of the spin-current flowing up into the free layer structure determines the signal voltage detected by amplifier 440.

As can be seen, the structure 402 is advantageously configured as a three terminal device rather than a four terminal device. The voltage detected across amplifier 440 is that existing between the electrical contacts to the second shield 410, and the common ground that the current lead 438 is connected to. In practice, it is convenient to have the first shield 408 electrically connecting to (and/or establishing) this common ground, and then establishing electrical connection 438 by physical contact with shield 408. This could be done eliminating the insulation layer 412 at some location away from the reference layer structure 402, and allowing direct electrical contact of conductive layer 406 with the first shield 408. The location of the establishment of this ground connection should physically be separated from the location of the reference layer structure 402 by one or more times the spin diffusion length of spin-conductive layer 406. This effectively eliminates as much as possible an undesired, secondary path to for the spin current injected into conductive layer 406 to flow that shunts it away from flowing up and into the free layer structure as is desired. This connection to a common ground can be made at a location that is removed from the ABS, and removed from the spin accumulation device 402.

Because no electrical/charge current flows from the reference layer structure 402 towards the free layer structure 404 through the spin-conductive layer 406, the electrical potential of layer 406 is essentially constant in this region. The electrical potential of layer 406 in this region is similarly independent of the pure spin-current flow through layer 406, and thus independent of the orientation of magnetization 428 of the free layer. The electrical potential of spin-conductive layer 406 is thus constant with respect to ground potential, the actual value determined by the level of the DC injected current 434 and the static electrical impedance between the reference layer structure 402 and the ground connection 438. By widening out the shape of the conductive layer 406 in the back end toward ground connection 438, this static impedance can be made relatively small. Hence, at signal frequencies, the potential of conductive layer 406 below the location of the free layer structure is electrically equivalent to ground. For this reason, measurement via the amplifier 440 of the AC electric signal potential between the second shield 410 and ground is electrically equivalent to a four terminal measurement with a hypothetical, perfectly spin-reflecting fourth terminal connection to layer 406 at or near the air bearing surface. Therefore, the present invention can achieve superior performance to an actual four terminal structure without the drawbacks which would make a physical implementation of a four terminal spin-accumulation sensor a practical impossibility.

Therefore, the present invention provides several advantages that render the spin accumulation device 402 practical for use in a magnetic data recording system. These include the simpler and practically feasible fabrication of a three terminal electrical configuration, the elimination of signal loss due to spin-current shunting by a physical fourth lead terminal, and no compromise in functionality of the hard bias or narrow gap linear read-back resolution, allowing greater data density than would be otherwise possible if additional lead layers were needed.

It should be pointed out that the structure shown, for example, in FIGS. 4 and 5 are for representation purposes only. Other variations would also be possible. For example, although the reference layer structure 402 was shown having the AFM 418 above the reference layer 414, and the contact layer 424 below the reference layer 414, this arrangement could be reversed. Similarly, although the free layer structure 404 is shown in FIG. 4 as having the contact layer 430 below the free layer 426, the order of these layers could also be reversed or otherwise rearranged. In addition, the spin-conductive layer 406 could be above the reference and free layer structures 402, 404 rather than below. Also, the ground connection could be made to the upper shield 410 rather than to the bottom shield 408, or could be made to some structure other than the shields altogether. Additionally, this device can be used in other applications of sensors able to detect magnetic fields on size scales below a few microns, such as scanning probe apparatus.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A spin accumulation sensor, comprising:
   a non-magnetic spin transport conductive layer;
   a reference layer structure located away from a free layer structure, the reference layer structure including a magnetic reference layer and a first thin contact layer, the first contact layer being located between the magnetic reference layer and the non-magnetic spin transport conductive layer;
   wherein the free layer structure is located at the air bearing surface, the free layer structure including a magnetic free layer, a second contact layer and a spin diffusion layer, the contact layer being located between the free magnetic layer and the non-magnetic spin transport conductive layer;
   first and second electrically conductive magnetic shields, the reference layer structure, free layer structure and nonmagnetic spin transport conductive layer being located between the first and second magnetic, electrically conductive shields; and
   a current or voltage source electrically connected with the reference layer structure so as to apply an electric current through the reference layer structure resulting in a spin current in the non-magnetic spin transport conductive layer, the current or voltage source also being connected to a common electric ground connection, the connection with the common ground being made at a location that is separated from the reference layer structure by a distance that is at least one or more times the spin diffusion length of the spin-conductive layer; and
   circuitry for measuring a signal voltage between a portion of the free layer structure and the common electric ground.

2. The spin accumulation sensor as in claim 1 wherein the spin diffusion layer is located between the magnetic free layer and the second electrically conductive magnetic shield, and wherein the spin diffusion layer comprises Pt, Ir or Re and has a spin diffusion length that is short enough to substantially mix the spins of current flowing through it.

3. The spin accumulation sensor as in claim 1 further comprising an electrically insulating layer sandwiched between the first electrically conductive magnetic shield and the non-magnetic spin transport conductive layer, and wherein the spin diffusion layer is sandwiched between the magnetic free layer and the second electrically conductive magnetic shield layer.

4. The spin accumulation sensor as in claim 1 further comprising a second electrically insulating layer between the magnetic reference layer and the second electrically conductive shield layer.

5. A spin accumulation sensor as in claim 1 wherein the current or voltage source includes a first lead electrically connected with the magnetic reference layer and a second lead electrically connected with the non-magnetic spin transport conductive layer and also with electric ground, and wherein the circuitry for measuring a signal voltage includes a first lead connected with the second electrically conductive magnetic shield and a second lead connected with the electric ground.

6. The spin accumulation sensor as in claim 5 wherein the second electrically conductive magnetic shield is electrically connected with the free layer structure.

7. The spin accumulation sensor as in claim 6 wherein the reference layer structure is electrically insulated from the second electrically conductive magnetic shield.

8. The spin accumulation sensor as in claim 1 wherein the first and second contact layers each comprise an metallic-like electrically conductive material.

9. The spin accumulation sensor as in claim 1 wherein the first and second contact layers each comprise a tunneling barrier material.

10. The spin accumulation sensor as in claim 1 wherein one of the first and second contact layers comprises a non-magnetic, metallic-like electrically conductive material and the other contact layer comprises a tunneling barrier material.

11. The spin accumulation sensor as in claim 1 wherein one of the first and second shields provides the common electric ground.

12. The spin accumulation sensor as in claim 1 where at least one of the first and second contact layers is a nano oxide layer, consisting of conducting pinholes in an insulating matrix.

13. The spin accumulation sensor as in claim 1 where the magnetic reference layer and the magnetic free layer each comprise Ni, Co, Fe or their alloys or a Heusler material, such as CoMnGe, CoMnSi, or layers of any of these materials.

14. The spin accumulation sensor as in claim 1 where the reference layer is wider in its planar dimension than the magnetic free layer.

* * * * *